United States Patent [19]
Uemura et al.

[11] Patent Number: 5,874,883
[45] Date of Patent: Feb. 23, 1999

[54] PLANAR-TYPE INDUCTOR AND FABRICATION METHOD THEREOF

[75] Inventors: Kazuyoshi Uemura; Kiyoshi Takahashi, both of Tokyo, Japan

[73] Assignee: NEC Corporation, Tokyo, Japan

[21] Appl. No.: 683,266

[22] Filed: Jul. 18, 1996

[30] Foreign Application Priority Data

Aug. 17, 1995 [JP] Japan .................................. 7-181350

[51] Int. Cl.⁶ .............................. H01F 5/00; H01F 27/28
[52] U.S. Cl. ........................................... 336/200; 336/232
[58] Field of Search .................................... 336/200, 232

[56] References Cited

U.S. PATENT DOCUMENTS

| | | | |
|---|---|---|---|
| 4,959,631 | 9/1990 | Hasegawa et al. | 336/200 |
| 5,307,045 | 4/1994 | Senda et al. | 336/200 |
| 5,384,274 | 1/1995 | Kanehachi | 437/47 |
| 5,477,204 | 12/1995 | Li | 336/232 |
| 5,495,213 | 2/1996 | Ikeda | 336/200 |
| 5,583,474 | 12/1996 | Mizoguchi et al. | 336/200 |

FOREIGN PATENT DOCUMENTS 4-5806  1/1992  Japan ................................... 336/200

OTHER PUBLICATIONS

"Multi–layer Spiral Inductors for MMICs" Tsutomu Takenaka and Hiroyo Ogawa, p. 394 (Proceedings of the 1990 Ieice Fall Conference).

"An Inductive Element for a Film Carrier", Nobuo Sato, Fuminori Ishitsuka and Masakaze Hosoya, p. 417 (Proceedings of the 1992 Ieice Fall Conference).

"Miniature Multilayer Spiral Inductors For GaAs MMICs", M.W. Geen, G.J. Green, R.G. Arnold, J.A. Jenkins, and R.H. Jansen, pp. 303–306 (GaAs IC symposium).

*Primary Examiner*—Michael L. Gellner
*Assistant Examiner*—Anh Mai

[57] ABSTRACT

A planar-type inductor that can restrain the maximum operable frequency from lowering even if the inductance part of the inductor is miniaturized. This inductor includes an insulating substructure and a patterned conductor layer having a predesigned geometric shape and formed on a chief surface of the substructure. The patterned conductor layer contains an inductance part for providing a wanted inductance value and a first lead part and a second lead part for electrically connecting the inductance part to an external circuit located outside the inductor. The inductance part has a first region and a second region located adjacent to each other at an interval. The inductor further includes a recess formed in the substructure between the first region and the second region of the inductance part. The recess extends along the first region and the second region. A parasitic capacitance between the first region and the second region is reduced due to the existence of the recess. Another patterned conductor layer extending along the pattern of the inductance part of the may be formed, instead of the recess, which reduces the parasitic capacitance due to the electrostatic shielding phenomenon.

12 Claims, 12 Drawing Sheets

PLANAR-TYPE INDUCTOR AND FABRICATION METHOD THEREOF

BACKGROUND OF THE INVENTION

1. Field of the Invention

The present invention relates to an inductive element or inductor and more particularly, to a planar-type inductor formed on an insulating substructure and a fabrication method thereof.

2. Description of the Prior Art

A planar-type inductor formed over a semiconductor substrate is one of the types of the conventional inductors that have been popularly used in a Monolithic Microwave Integrated Circuit (MMIC) device. The planar-type inductor typically has a ribbon or spiral configuration which includes a conductor ribbon or spiral formed over a semiconductor substrate through an insulating layer on the substrate.

An example of the conventional planar-type inductors having the spiral configuration is shown in FIGS. 1 and 2.

As seen from FIGS. 1 and 2, this conventional inductor includes an insulating substructure composed of a semiconductor substrate 111, a first insulating layer 112 formed on a chief surface of the substrate 111, and a second insulating layer 114 formed on the first insulating layer 112 and having a groove 114a and two contact holes 116a and 116b. The surface of the second insulating layer 114 constitutes a chief surface of the substructure.

The contact holes 116a and 116b vertically extend perpendicular to the chief surface of the substrate 111. The groove 114a horizontally extends along the chief surface of the substrate 111 between the contact holes 116a and 116b.

A first patterned conductor layer 113 is formed on the first insulating layer 112. The layer 113 is buried within the groove 114a of the second insulating layer 114, and runs from a position corresponding to the inner contact hole 116a to another position corresponding to the outer contact hole 116b.

As clearly shown from FIG. 1, a second patterned conductor layer 110 is formed on the surface of the second insulating layer 114. The second conductor layer 110 contains an inductance part 1' for providing a wanted inductance value and first and second lead parts 2' and 3' for electrically connecting the inductance part 1' to an external circuit located outside the inductor. The inductance part 1' has a square spiral shape. The first lead part 2' has a strip-like shape and is joined to the outer end of the part 1'. The second lead part 3' also has a strip-like shape; however, it is formed apart from the inductance part 1'.

The contact hole 116a of the second insulating layer 114 is located at the inner end of the inductance part 1', in other words, at the center of the spiral pattern. The inner end of the inductance part 1' is electrically connected to one end of the underlying first conductor layer 113 through the hole 116a. The second lead part 3' is electrically connected to the other end of the underlying first conductor layer 113 through the hole 116b. Thus, the inner end of the inductance part 1' is electrically connected to the second lead part 3' through the first conductor layer 113. This means that the patterned first conductor layer 113 serves as an interconnection conductor for the inner end of the inductance part 1' and the second lead part 3'.

The second conductor layer 110 has a two-layer structure made of a lower conductive sublayer 110a and an upper conductive sublayer 110b. The lower conductive sublayer 110a is contacted with the first conductor layer 113 and the second insulating layer 110. The upper conductive sublayer 110b is formed onto the lower conductive sublayer 110a. The lower sublayer 110a serves as a current path for forming the upper sublayer 110b by a plating process.

Between any two neighboring regions of the spiral-shaped inductance part 1' of the conductor layer 110, the second insulating layer 114 is exposed.

The first insulating layer 112 serves to electrically insulate the first conductor layer 113 from the underlying substrate 111. The second insulating layer 114 serves to electrically insulate the second conductor layer 110 from the underlying first conductor layer 113; in other words, the layer 114 serves as an interlayer insulating layer.

The inductance value of the conventional inductor shown in FIGS. 1 and 2 can be expressed as the following equation (1), which was obtained through experiments.

$$L = \frac{0.27 \cdot D^{\frac{8}{3}}}{P^{\frac{5}{3}}\left(1+\frac{1}{r}\right)^{\frac{5}{3}}} \quad (1)$$

where L is the inductance (nH), D is a length (mm) of one side of the spiral-shaped inductance part 1', p is a width (mm) of the spiral-shaped conductor layer 110 of the inductance part 1', q is an interval (mm) between the neighboring regions of the spiral-shaped conductor layer 110, and r is a ratio of p to q, i.e., (p/q).

When p=q, the equation (1) is simplified to the following equation (2):

$$L = \frac{0.085 \cdot D^{\frac{8}{3}}}{P^{\frac{5}{3}}} \quad (2)$$

For example, if p=q=0.05 mm and D=0.5 mm, the inductance L is calculated from the above equation (1) or (2) as approximately 2 nH.

Recently, to decrease the size and fabrication cost of a semiconductor integrated circuit device, not only active components (e.g., transistors) but also passive components (e.g., inductors and capacitors) have been required to be miniaturized more and more.

For the above planar-type inductors, the miniaturization requirement is typically accomplished by decreasing the size of the spiral-shaped conductor layer 110. In other words, this problem is solved by reducing the size of the width p and the interval q.

For example, if p=0.05 mm, q=0.1 mm and D=0.64 mm, the inductance L is calculated from the above equation (1) to be approximately 2 nH. If the spiral-shaped conductor 110 having this dimension is formed on a GaAs substrate, the inter-line capacitance C of the conductor 110 is equal to approximately 0.12 pF. This value is obtained by an approximation of regarding the two neighboring regions of the spiral-shaped conductor 110 as a coplanar strip lines.

The resonance frequency $f_0$ in this case is approximately equal to 10.3 GHz, where $f_0$ is defined as the following equation (3):

$$f_0 = \frac{1}{2\pi\sqrt{LC}} \quad (3)$$

To reduce the plan size of the spiral-shaped conductor 110 to 60% of its original size, if the above parameters are designed as p=q=0.05 mm and D=0.5 mm, the inductance L can be maintained at approximately 2 nH. However, the inter-line capacitance C of the conductor 110 increases up to approximately 0.14 pF and as a result, the resonance frequency $f_0$ will decrease to approximately 9.5 GHz, which is lower than the case of the original size by approximately 0.8 GHz.

Thus, with the conventional inductor shown in. FIGS. 1 and 2, when the interval q of the neighboring regions of the spiral-shaped conductor 110 is decreased for miniaturization, the inter-line capacitance C will increase and the resonance frequency $f_0$ will decrease and consequently, a problem that the maximum operable frequency is lowered occurs.

SUMMARY OF THE INVENTION

Accordingly, an object of the present invention is to provide a planar-type inductor that can restrain the maximum operable frequency from lowering even if the inductance part of the inductor is miniaturized and a fabrication method of the inductor.

Another object of the present invention is to provide a planar-type inductor that can expand the operable frequency range and a fabrication method of the inductor.

According to a first aspect of the present invention, a planar-type inductor is provided, which includes (a) an insulating substructure and (b) a patterned conductor layer having a predesigned geometric shape and formed on a chief surface of the substructure. The patterned conductor layer contains an inductance part for providing a wanted inductance value and a first lead part and a second lead part for electrically connecting the inductance part to an external circuit located outside the inductor. The inductance part has a first region and a second region located adjacent to each other at an interval.

The inductor further includes (c) a recess formed in the substructure between the first region and the second region of the inductance part. The recess extends alone the first region and the second region.

A parasitic capacitance between the first region and the second region is reduced due to the existence of the recess.

With the planar-type inductor according to the first aspect, since the recess is formed in the substructure to extend along the first and second regions of the inductance part between the first and second regions, the dielectric constant in the recess is approximately equal to that of the atmospheric air. In other words, the dielectric constant in the recess is approximately equal to unity (1). This means that the dielectric constant in the recess is less than that of the case where no recess is formed.

As a result, the parasitic capacitance between the adjacent first and second regions of the inductance part is decreased and accordingly, the maximum operable frequency of the inductor can be restrained from lowering even if the inductance part of the inductor is miniaturized.

Also, because the maximum operable frequency is restrained from lowering, the operable frequency range of the inductor can be expanded.

In a preferred embodiment of the inductor according to the first aspect, the substructure comprises a semiconductor substrate, a first insulating layer formed on a chief surface of the substrates and a second insulating layer formed on the first insulating layer. A surface of the second insulating layer constitutes the chief surface of the substructure. The recess is formed in the second insulating layer.

In another preferred embodiment of the inductor according to the first aspect, the substructure is formed by an insulating substrate, and a chief surface of the insulating substrate constitutes the chief surface of the substructure. The recess is formed in the insulating substrate.

In still another preferred embodiment of the inductor according to the first aspect, the inductance part of the conductor layer has a spiral plan shape, the first lead part is directly joined to an outer end of the inductance part, and the second lead part is formed apart from the inductance part. The second lead part is electrically connected to an inner end of the inductance part through an interconnection conductor. The interconnection conductor may be formed in the substructure or over the inductance part to link the second lead part with the inner end.

When the interconnection conductor is be formed over the inductance part, a conductive wire is preferably used as the interconnection conductor.

The recess may be formed to be divided into at least two parts or to be continuous.

In a further preferred embodiment of the inductor according to the first aspect, the inductance part of the conductor layer has a square wave shape, the first lead part is directly joined to an outer end of the inductance part, and the second lead part is directly joined to another outer end thereof.

According to a second aspect of the present invention, another planar-type inductor is provided, which includes (a) an insulating substructure and (b) a first patterned conductor layer having a predesigned geometric shape and formed on a chief surface of said substructure. The first patterned conductor layer contains an inductance part for providing a wanted inductance value and a first lead part and a second lead part for electrically connecting the inductance part to an external circuit located outside the inductor. The inductance part has a first region and a second region located adjacent to each other at an interval.

The inductor further includes (c) a second patterned conductor layer formed in the substructure between the first region and the second region of the inductance part. The second conductor layer extends along the first region and the second region.

A parasitic capacitance between the first region and the second region is reduced due to electrostatic shielding or screening by the second conductor layer.

With the planar-type inductor according to the second aspect, since the second patterned conductor layer is formed in the substructure to extend along the first and second regions of the inductance part between the first and second regions, the parasitic capacitance between the adjacent first and second regions of the inductance part is decreased due to the electrostatic shielding or screening.

As a result, the maximum operable frequency of the inductor can be restrained from lowering even if the inductance part of the inductor is miniaturized. This lead to expansion of the operable frequency range of the inductor.

In a preferred embodiment of the inductor according to the second aspect, the substructure comprises a semiconductor substrate, a first insulating layer formed on a chief surface of the substrate, and a second insulating layer formed on the first insulating layer. A surface of the second insulating layer constitutes the chief surface of the substructure. The second conductor layer is formed in the second insulating layer.

In another preferred embodiment of the inductor according to the second aspect, the inductance part of the conductor layer has a spiral plan shape, the first lead part is directly joined to an outer end of the inductance part, and the second lead part is formed apart from the inductance part, and the second lead part is electrically connected to an inner end of the inductance part through an interconnection conductor formed in the substructure.

Preferably, the second conductor layer is grounded on operation or electrically connected to the substrate.

According to a third aspect of the present invention, a fabrication method of a planar-type inductor is provided, which comprises the following steps (a), (b) and (c).

In the step (a), an insulating substructure is prepared.

In the step (b), a patterned conductor layer having a predesigned geometric shape is formed on a chief surface of the substructure. The patterned conductor layer contains an inductance part for providing a wanted inductance value and a first lead part and a second lead part for electrically connecting the inductance part to an external circuit located outside the inductor. The inductance part has a first region and a second region located adjacent to each other at an interval.

In the step (c), a recess is formed in the substructure between the first region and the second region of the inductance part to extend along the first region and the second region.

Thus, a parasitic capacitance between the first region and the second region is reduced due to the existence of the recess.

With the fabrication method according to the third aspect, the planar-type inductor according to the first aspect can be fabricated.

In a preferred embodiment of the method according to the third aspect, the step (a) comprises a step of forming a first insulating layer on a chief surface of a substrate, and a step of forming a second insulating layer on the first insulating layer. A surface of the second insulating layer constitutes the chief surface of the substructure. The recess is formed in the second insulating layer.

In another preferred embodiment of the method according the third aspect, the inductance part of the conductor layer is formed to have a spiral plan shape in the step (b). Also, in the step (b), the first lead part is formed to be directly joined to an outer end of the inductance part, and the second lead part is formed apart from the inductance part and is electrically connected to an inner end of the inductance part through an interconnection conductor formed in the substructure.

In still another preferred embodiment of the method according to the third aspect, the inductance part of the conductor layer is formed to have a spiral plan shape in the step (b). Further, in the step (b), the first lead part is formed to be directly joined to an outer end of the inductance part, and the second lead part is formed apart from the inductance part and electrically connected to an inner end of the inductance part through an interconnection conductor formed in the second insulating layer.

According to a fourth aspect of the present invention, another fabrication method of a planar-type inductor is provided, which comprises the following steps (a), (b) and (c).

In the step (a), an insulating substructure is prepared.

In the step (b), a first patterned conductor layer having a predesigned geometric shape is formed on a chief surface of the substructure. The first patterned conductor layer contains an inductance part for providing a wanted inductance value and a first lead part and a second lead part for electrically connecting the inductance part to an external circuit located outside the inductor. The inductance part has a first region and a second region located adjacent to each other at an interval.

In the step (c), a second patterned conductor layer is formed in the substructure between the first region and the second region of the inductance part to extend along the first region and the second region.

Thus, a parasitic capacitance between the first region and the second region is reduced due to electrostatic shielding by the second conductor layer.

In a preferred embodiment of the method according to the fourth aspect, the step (a) comprises a step of preparing a semiconductor substrate, a step of forming a first insulating layer on a chief surface of the substrate, and a step of forming a second insulating layer on the first insulating layer. A surface of the second insulating layer constitutes the chief surface of the substructure. The second conductor layer is formed in the second insulating layer.

In another preferred embodiment of the method according to the fourth aspect, the inductance part of the conductor layer is formed to have a spiral plan shape in the step (b). Further, in the step (b), the first lead part is formed to be directly joined to an outer end of the inductance part, and the second lead part is formed apart from the inductance part and electrically connected to an inner end of the inductance part through an interconnection conductor formed in the substructure.

It is preferred that the second conductor layer is formed to be grounded on operation or electrically connected to the substrate.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
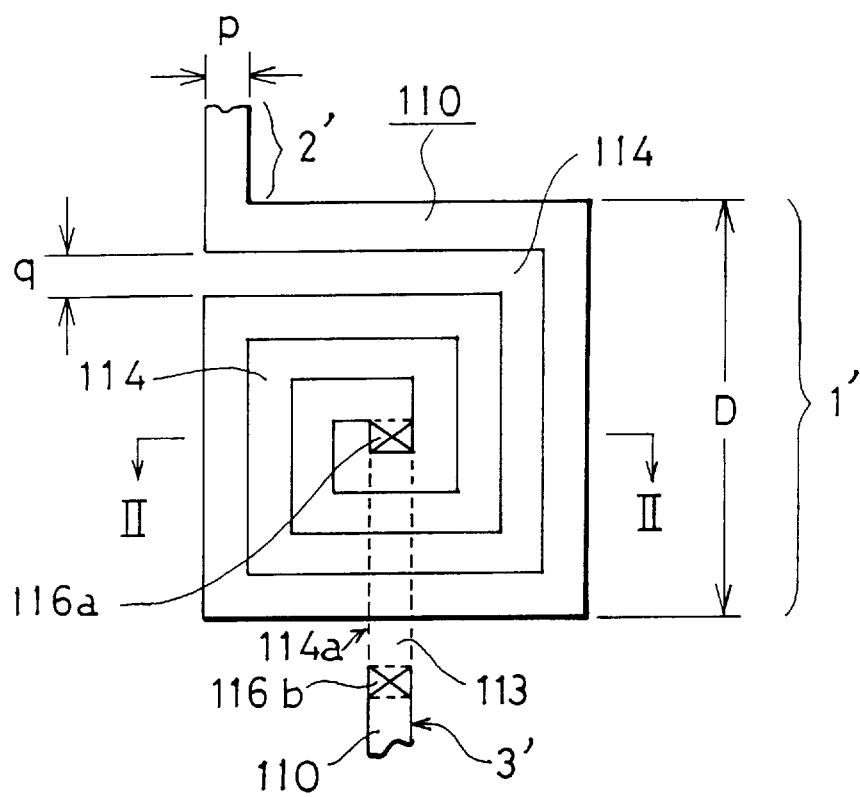
FIG. 1 is a schematic plan view of a conventional planar-type inductor.

Preferred embodiments of the present invention will be described bellow while referring to the drawings attached.

FIRST EMBODIMENT

Figure 3:
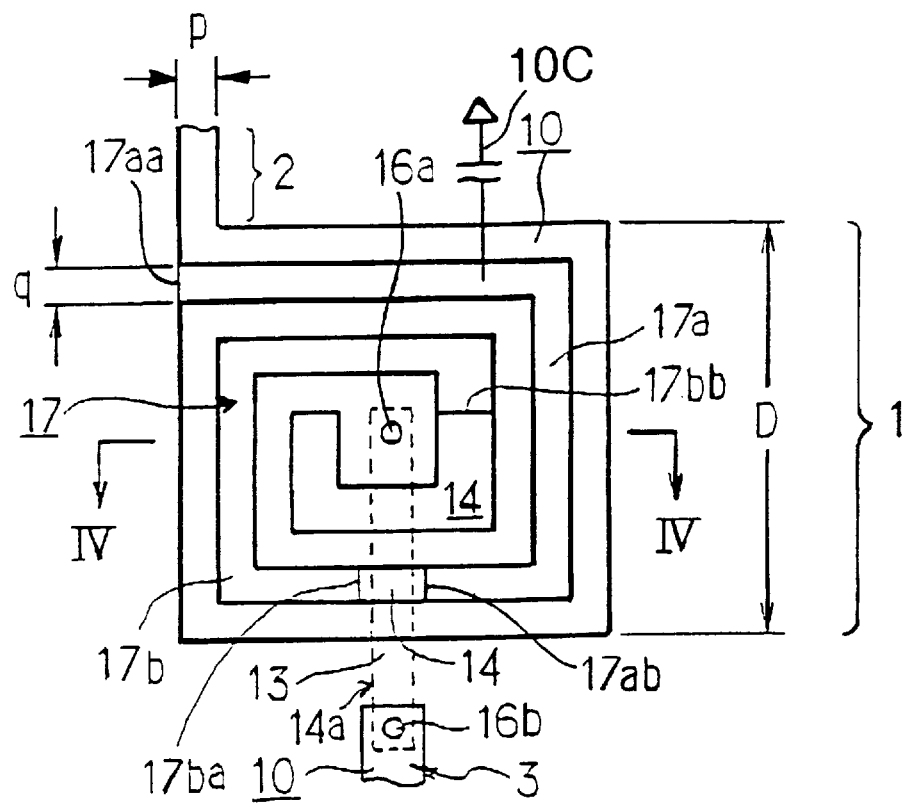
FIG. 3 is a schematic plan view of a planar-type inductor according to a first embodiment of the invention.
Figure 4:
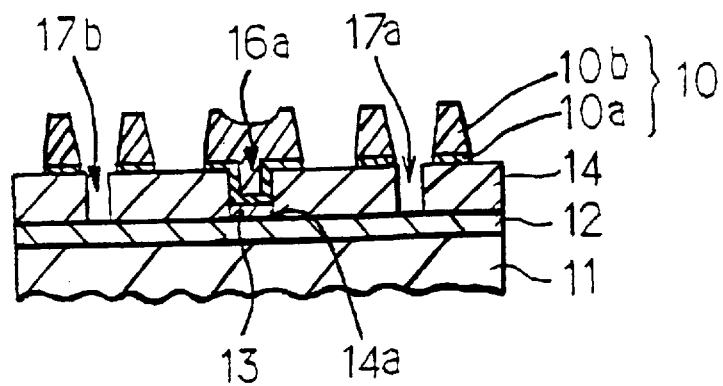
FIG. 4 is a cross-sectional view along the line IV—IV in FIG. 3, which shows the structure of the inductor according to the first embodiment.

A planar-type inductor according to a first embodiment of the present invention is shown in FIGS. 3 and 4, which has a square spiral configuration.

As shown in FIG. 4, this inductor includes an insulating substructure composed of a semiconductor substrate 11, a first insulating layer 12 formed on a chief surface of the substrate 11, and a second insulating layer 14 formed on the first insulating layer 12 and having a linear groove 14a and two circular contact holes 16a and 16b. The surface of the second insulating layer 14 constitutes a chief surface of the substructure.

The substrate 11 is, for example, a gallium arsenide (GaAs) or silicon (Si) substrate. Each of the first and second insulating layers 12 and 14 is, for example, a silicon dioxide ($SiO_2$) layer.

A first patterned conductor layer 13 is formed on the first insulating layer 12. The layer 13 has a linear plan shape and is buried within the groove 14a of the second insulating layer 14. The layer 13 runs from a position corresponding to the inner contact hole 16a to another position corresponding to the outer contact hole 16b.

As clearly shown in FIG. 3, a second patterned conductor layer 10 is formed on the surface of the second insulating layer 14. The second conductor layer 10 contains an inductance part 1 for providing a wanted inductance value and first and second lead parts 2 and 3 for electrically connecting the inductance part 1 to an external circuit located outside the inductor.

In the first embodiment, the inductance part 1 has a square spiral shape. The first lead part 2 has a strip-like shape and is joined to the outer end of the part 1. The second lead part 3 also has a strip-like shape; however, it is formed apart from the inductance part 1.

The inner contact hole 16a of the second insulating layer 14 is located at the inner end of the inductance part 1, in other words, at the center of the spiral pattern. The inner end of the inductance part 1 is electrically connected to one end of the underlying first conductor layer 13 through the hole 16a. The second lead part 3 is electrically connected to the other end of the underlying first conductor layer 13 through the hole 16b. Thus, the inner end of the inductance part 1 is electrically connected to the second lead part 3 through the first conductor layer 13, This means that the patterned first conductor layer 13 serves as an interconnection conductor for the inner end of the inductance part 1 and the second lead part 3.

The second conductor layer 10 has a two-layer structure made of a lower conductive sublayer 10a and an upper conductive sublayer 10b. Therefore, the lower conductive sublayer 10a is contacted with the second conductor layer 14 and the first conductor layer 13.

The first insulating layer 12 serves to electrically insulate the first conductor layer 13 from the underlying substrate 11. The second insulating layer 14 serves to electrically insulate the second conductor layer 10 from the underlying first conductor layer 13; in other words, the layer 14 serves as an interlayer insulating layer.

Figure 2:
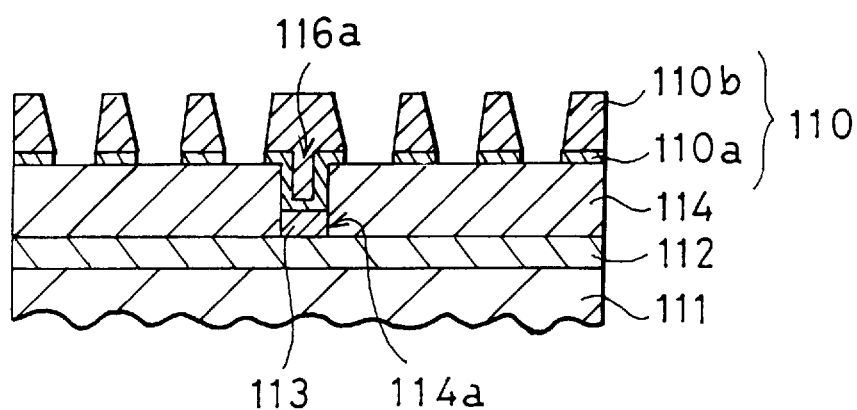
FIG. 2 is a cross-sectional view along the line II—II in FIG. 1, which shows the structure of the conventional inductor of FIG. 1.

The above structure is approximately the same as that of the conventional planar-type inductor shown in FIGS. 1 and 2.

Unlike the above conventional inductor, in the inductor of the first embodiment, a recess 17 is formed in the second insulating film 14 between any two neighboring regions of the spiral-shaped inductance part 1 of the conductor layer 10. The first insulating layer 12 is exposed from the second insulating layer 14 through the recess 17. The second insulating layer 14 is exposed in the area where the recess 17 does not exist.

The recess 17 is divided into first and second portions 17a and 17b in order to avoid the contact with the first conductor layer 13. One end 17aa of the first portion 17a is located near the outer end of the inductance part 1 of the second conductor layer 10. The other end 17ab of the first portion 17a is located near the groove 14a of the second insulating layer 14, in other words, near the intersection of the recess 17 and the groove 14a. One end 17ba of the second portion 17b is located near the groove 14a of the second insulating layer 14, in other words, near the intersection of the recess 17 and the groove 14a. The other end 17bb of the second portion 17b is located near the inner end of the inductance part 1 of the second conductor 10. The ends 17ab and 17ba are positioned on each side of the groove 14a.

With the planar-type inductor according to the first embodiment, since the recess 17 is formed between the neighboring regions of the inductance part 1 in the second insulating layer 14 so as to extend along the neighboring regions, the dielectric constant in the recess 17 is approximately equal to that of the atmospheric air. In other words, the dielectric constant in the recess 17 is approximately equal to unity (1). This means that the dielectric constant between the adjacent regions of the second conductor layer 10 is decreased to a value less than that of the conventional inductor due to the recess 17.

For example, when the second insulating layer 14 is made of $SiO_2$ whose dielectric constant is 3.8, the dielectric constant between the adjacent regions of the second conductor layer 10 becomes approximately equal to 1 due to the recess 17 and accordingly the dielectric constant can be decreased to approximately one third (⅓) of the value of the conventional inductor.

As a result, the parasitic capacitance 10c between the adjacent regions of the inductance part 1 of the second conductor layer 10 is decreased and accordingly, the maximum operable frequency of the inductor can be restrained from lowering even if the inductance part 1 of the inductor is miniaturized.

Also, because the maximum operable frequency is restrained from lowering, the operable frequency range of the inductor can be expanded.

Figure 5A:
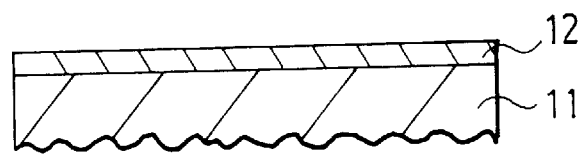
FIGS. 5A to 5L are cross-sectional views along the line IV—IV in FIG. 3, which show a fabrication process sequence of the inductor according to the first embodiment, respectively.

The planar-type inductor according to the first embodiment is fabricated by the following process sequence:

First, as shown in FIG. 5A, the first insulating layer 12 is formed on the chief surface of the semiconductor substrate 11 by a plasma-enhanced Chemical Vapor Deposition (CVD) technique or the like. The thickness of the layer 12 is 700 nm.

Figure 5B:
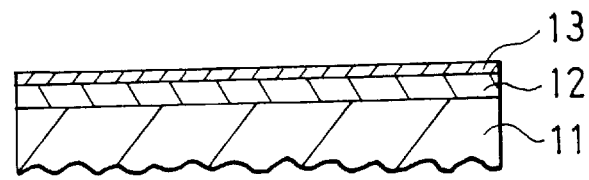
Figure 5C:
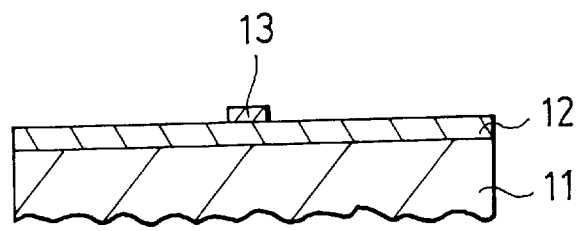

Next, as shown in FIG. 5B, the first conductor layer 13 is formed on the first insulating layer 12 by an evaporation or sputtering technique. The layer 13 is then patterned to the linear shape by popular photolithography and dry etching techniques, resulting in the structure shown in FIG. 5C.

Figure 5D:
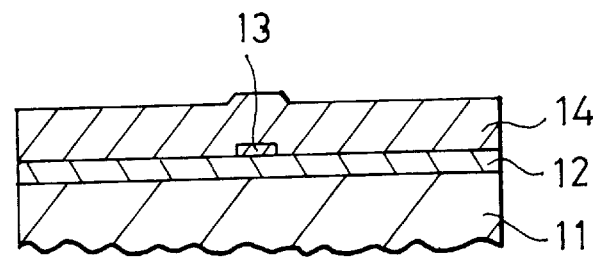
Figure 5E:
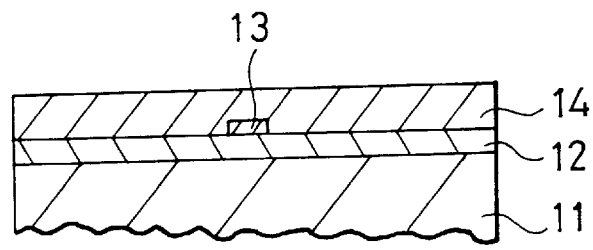

The second insulating layer 14 is formed on the exposed first insulating layer 12 to cover the remaining first conductor layer 13 by a plasma-enhanced CVD technique or the like, as shown in FIG. 5D. The thickness of the layer 14 is 1 μm. The surface of the layer 14 is then planarized by a Spin On Glass (SOG) or selective etching technique using a masking photoresist film. The state at this stage is shown in FIG. 5E.

Figure 5F:
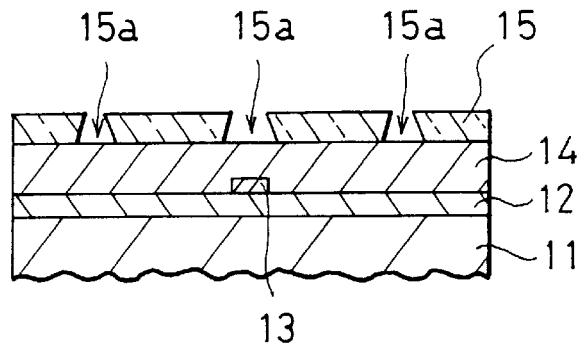

Subsequently, as shown in FIG. 5F, a patterned photoresist film 15 is formed on the second insulating layer 14 by a popular photolithography technique. The film 15 has windows 15a for the inner and outer contact holes 16a and 16b and for the respective portions 17a and 17b of the recess 17.

Figure 5G:
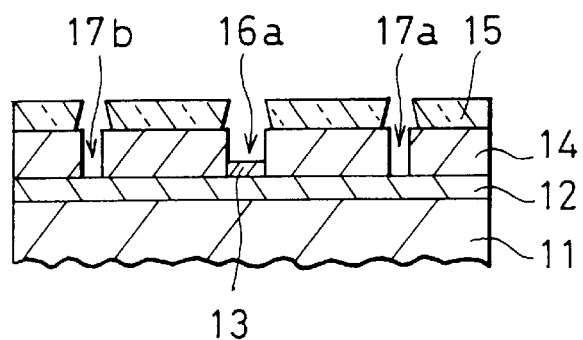
Figure 5H:
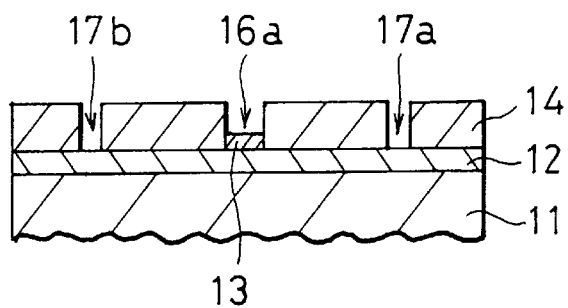
Figure 5I:
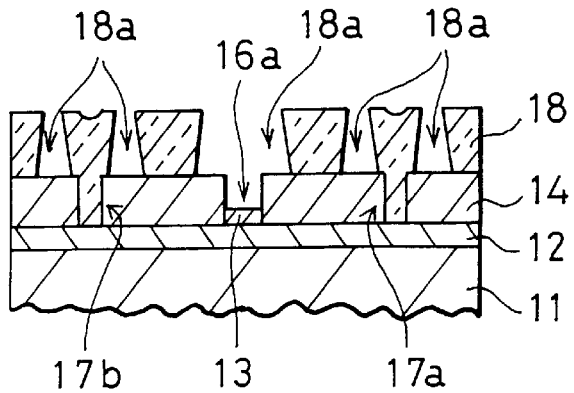

Using the patterned photoresist film 15 as a mask, the second insulating layer 14 is selectively etched by a popular etching technique to thereby form the contact holes 16a and 16b and the first and second portions 17a and 17b of the recess 17, as shown in FIG. 5G. At this stage, the first conductor layer 13 is partially exposed from the second insulating layer 14 through the contact holes 16a and 16b. The first insulating layer 12 is partially exposed from the second insulating layer 14 through the portions 17a and 17b. The film 15 is then removed (see FIG. 5H), Further, as shown in FIG. 5I, a patterned photoresist film 18 is formed on the second insulating layer 14 by a popular photolithography technique. The film 18 has windows 18a for the spiral-shaped second conductor layer 10.

Figure 5J:
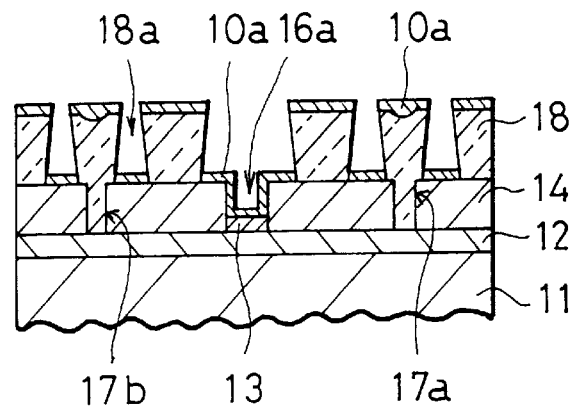

Using the patterned photoresist film 18 as a mask, the lower conductive sublayer 10a is selectively formed on the second insulating layer 14 by a popular evaporation or sputtering technique, as shown in FIG. 5J. Here, the lower conductive sublayer 10b serves as a plating current path and therefore, the sublayer 10b is made of titanium (Ti), platinum (Pt) and gold (Au) films which are successively formed on the layer 14 by a popular evaporation or sputtering technique.

Figure 5K:
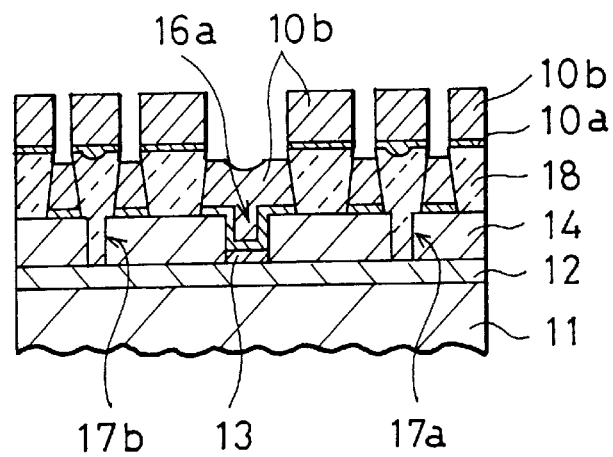

Following this, using the same patterned photoresist film 18 as a mask, the upper conductive sublayer 10b is selectively formed on the lower conductive sublayer 10a by a electrolyte or electroless plating technique, as shown in FIG. 5K. The upper sublayer 10b is, for example, made of gold.

Figure 5L:
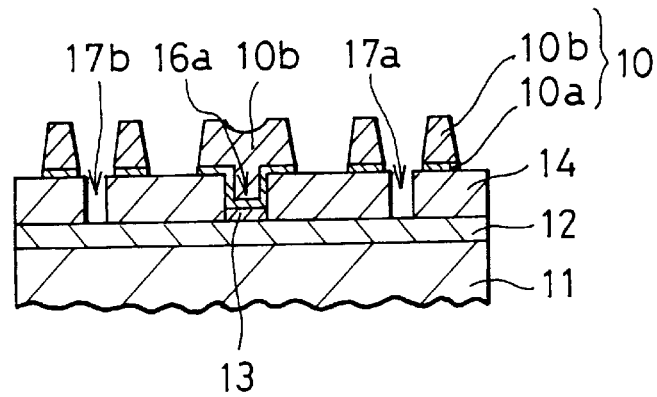

Then, the photoresist film 18 is removed, thereby remaining selectively the lower and upper sublayers 10a and 10b forming the patterned second conductor layer 10 on the second insulating layer 14, as shown in FIG. 5L.

Thus, the planar-type inductor according to the first embodiment is obtained.

SECOND EMBODIMENT

Figure 6:
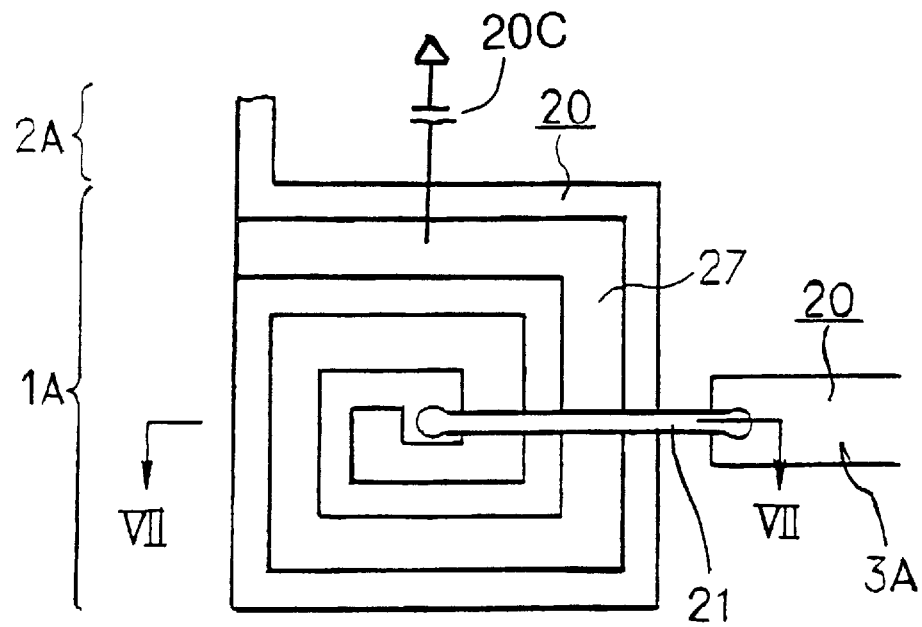
FIG. 6 is a schematic plan view of a planar-type inductor according to a second embodiment of the invention.
Figure 7:
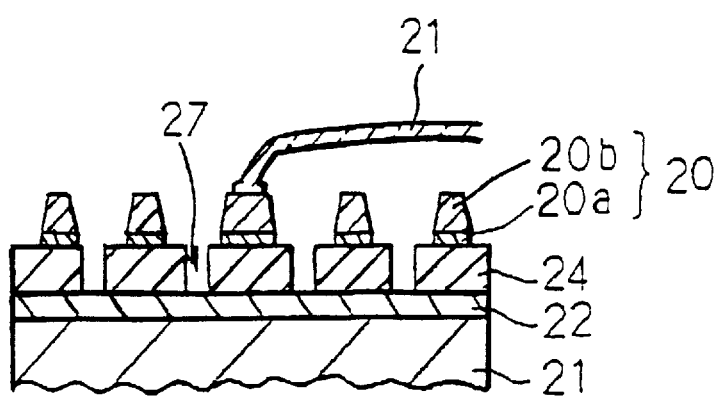
FIG. 7 is a cross-sectional view along the line VII—VII in FIG. 6, which shows the structure of the inductor according to the second embodiment.

A planar-type inductor according to a second embodiment of the present invention is shown in FIGS. 6 and 7, in which a bonding wire 21 is used for the interconnection conductor instead of the patterned first conductor layer 13 in the first embodiment. The wire 21 is, for example, made of gold (Au) or silver (Ag).

As shown in FIG. 7, this inductor includes an insulating substructure composed of a semiconductor substrate 21, a first insulating layer 22 formed on a chief surface of the substrate 21, and a second insulating layer 24 formed on the first insulating layer 22. Unlike the first embodiment, the layer 24 has no groove and no contact holes as shown in the first embodiment. The surface of the second insulating layer 24 constitutes a chief surface of the substructure.

Each of the substrate 21 and the first and second insulating layers 22 and 24 may be made of the same material as that in the first embodiment.

As clearly shown in FIG. 6, a patterned conductor layer 20 is formed on the surface of the second insulating layer 24. The conductor layer 20 contains an inductance part 1A for providing a wanted inductance value and first and second lead parts 2A and 3A for electrically connecting the inductance part 1A to an external circuit located outside the inductor.

Each of the inductance part 1A and the first and second lead parts 2 and 3 has the same shape as that in the first embodiment, respectively.

The inner end of the inductance part 1A is connected to the second lead part 3A by the bonding wire 21 serving as the interconnection conductor. This wire 21 is placed over the part 1A through the atmospheric air.

The conductor layer 20 has a two-layer structure made of a lower conductive sublayer 20a and an upper conductive sublayer 20b. Therefore, the lower conductive sublayer 20a is contacted with the second insulating layer 24.

The first and second insulating layers 22 and 24 provide the same services as those in the first embodiment.

A recess 27 is formed in the second insulating layer 24 between any two neighboring regions of the spiral-shaped inductance part 1A of the conductor layer 20. The first insulating layer 22 is exposed from the second insulating layer 24 through the recess 27. The second insulating layer 24 is exposed in the area where the recess 27 does not exist.

The recess 27 is not divided and is made continuous, which extends from the inner end of the spiral-shaped conductor 20 to the outer end thereof, because no groove is required for the second insulating layer 24 in this embodiment.

With the planar-type inductor according to the second embodiment, since the recess 27 is formed between the neighboring regions of the inductance part 1A in the second insulating layer 24 so as to extend along the neighboring regions, the dielectric constant in the recess 27 is approximately equal to that of the atmospheric air. As a result, the parasitic capacitance 20c between the adjacent regions of the inductance part 1A of the conductor layer 20 is decreased and accordingly, the maximum operable frequency of the inductor can be restrained from lowering even if the inductance part 1A of the inductor is miniaturized.

Also, because the maximum operable frequency is restrained from lowering, the operable frequency range of the inductor can be expanded.

Further, since the bonding wire 21 extending through the atmospheric air is used for the interconnection conductor, the parasitic capacitance of the entire inductor, thereby further restraining the resonance frequency lowering compared with the first embodiment.

It is clear that the planar-type inductor according to the second embodiment is fabricated by a similar process sequence to that of the first embodiment.

THIRD EMBODIMENT

Figure 8:
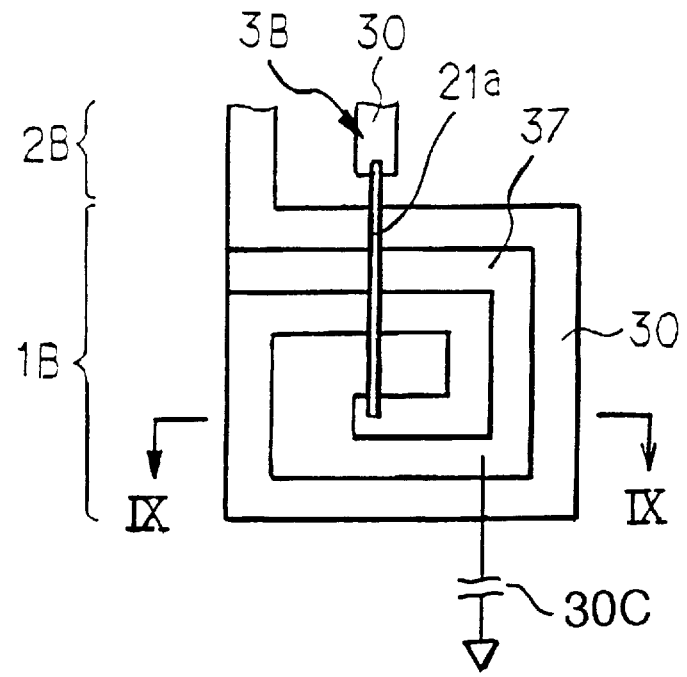
FIG. 8 is a schematic plan view of a planar-type inductor according to a third embodiment of the invention.
Figure 9:
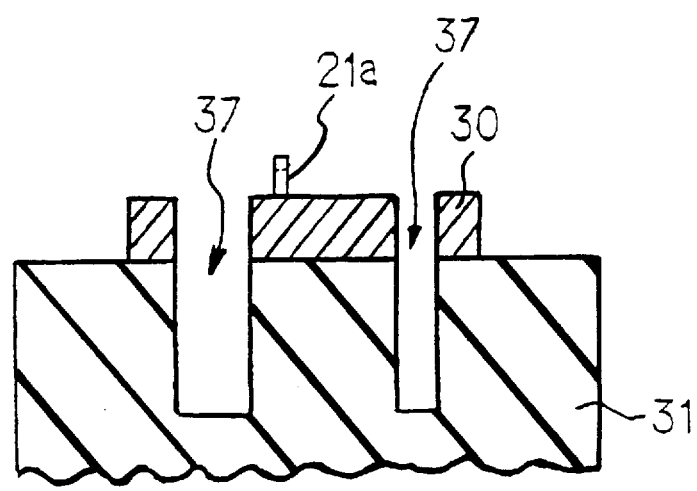
FIG. 9 is a cross-sectional view along the line IX—IX in FIG. 8, which shows the structure of the inductor according to the third embodiment.

A planar-type inductor according to a third embodiment of the present invention is shown in FIGS. 8 and 9, in which an insulating substrate 31 is used instead of the combination of the semiconductor substrate 11 and the first and second insulating layers 12 and 14 in the first embodiment. The insulating substrate 31 is, for example, made of alumina ($Al_2O_3$) or the like. Also, similar to the second embodiment, a bonding wire 21a is used as the interconnection conductor.

As shown in FIG. 9 this inductor includes the insulating substrate 31. The chief surface of the substrate 31 constitutes a chief surface of the substructure.

As clearly shown in FIG. 8, a patterned conductor layer 30 is directly formed on the chief surface of the substrate 31. The conductor layer 30 contains an inductance part 1B for providing a wanted inductance value and first and second lead parts 2B and 3B for electrically connecting the inductance part 1B to an external circuit located outside the inductor.

Each of the inductance part 1B and the first and second lead parts 2B and 3B has the same shape as that in the first embodiment, respectively.

The inner end of the inductance part 1B is connected to the second lead part 3B by the bonding wire 21a serving as the interconnection conductor. This wire 21a is placed over the part 1B through the atmospheric air.

Unlike the first and second embodiments, the conductor layer 30 has a single-layer structure. The conductor layer 30 corresponds to the patterned first conductive layer 10 or 20 in the first or second embodiments.

A spiral-shaped recess 37 is formed in the insulating substrate 31 itself between any two neighboring regions of the spiral-shaped inductance part 1B of the conductor layer 30. The chief surface of the substrate 31 is exposed from the conductor layer 30 through the recess 37.

The recess 37 is not divided and is made continuous, which extends from the inner end of the spiral-shaped conductor 30 to the outer end thereof, because no groove is required for the insulating substrate 31 in this embodiment.

With the planar-type inductor according to the third embodiment, the same advantages or effects as those in the second embodiment is obtained.

It is clear that the planar-type inductor according to the third embodiment is fabricated by a similar process sequence to that of the first embodiment.

FOURTH EMBODIMENT

Figure 10:
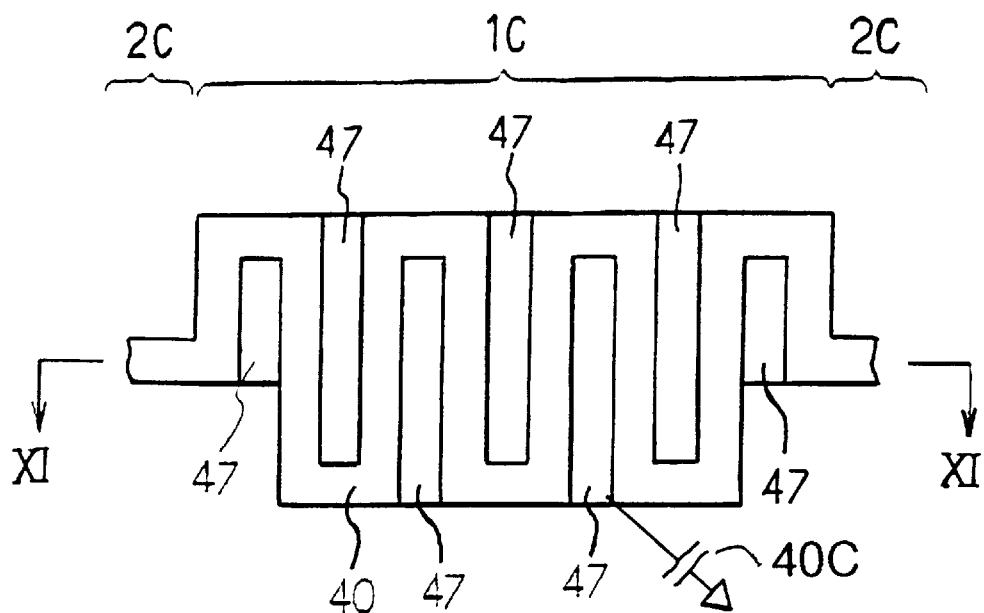
FIG. 10 is a schematic plan view of a planar-type inductor according to a fourth embodiment of the invention.
Figure 11:
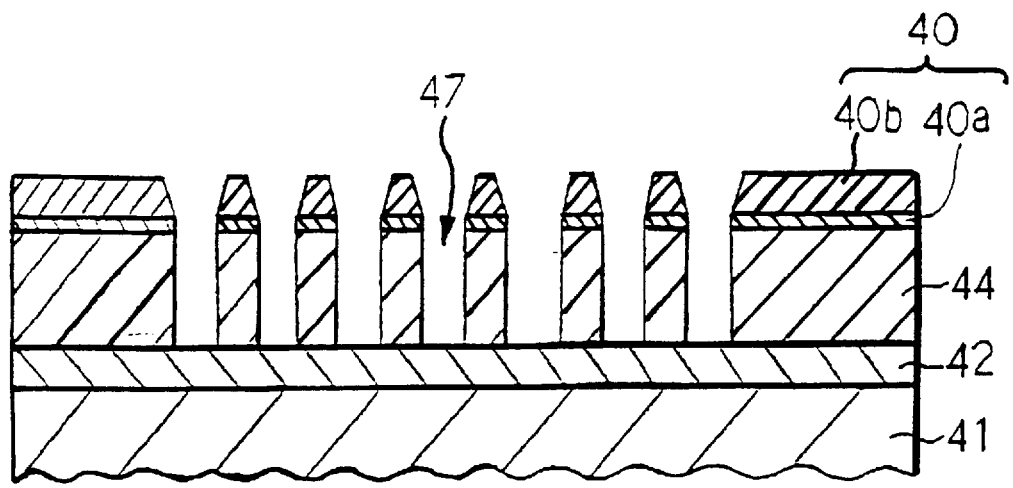
FIG. 11 is a cross-sectional view along the line XI—XI in FIG. 10, which shows the structure of the inductor according to the fourth embodiment.

A planar-type inductor according to a fourth embodiment of the present invention is shown in FIGS. 10 and 11, which includes an insulating substructure composed of a semiconductor substrate 41, a first insulating layer 42 formed on a chief surface of the substrate 41, and a second insulating layer 44 formed on the first insulating layer 42. The surface of the second insulating layer 44 constitutes a chief surface of the substructure.

Each of the substrate 41 and the first and second insulating layers 42 and 44 may be made of the same material as that in the first embodiment.

As clearly shown from FIG. 10, a patterned conductor layer 40 is formed on the surface of the second insulating layer 44. The second conductor layer 40 contains an inductance part 1C for providing a wanted inductance value and first and second lead parts 2C and 3C for electrically connecting the inductance part 1C to an external circuit located outside the inductor.

In the fourth embodiment, unlike the first to third embodiments, the inductance part 1C has a square wave shape. The first lead part 2C has a strip-like shape and is joined to one end of the part 1C. Similarly, the second lead part 3C has a strip-like shape and is joined to the other end of the part 1C.

The conductor layer 40 has a two-layer structure made of a lower conductive sublayer 40a and an upper conductive sublayer 40b. Therefore, the lower conductive sublayer 40a is contacted with the second insulating layer 44.

Each of the first and second insulating layers 42 and 44 provides the same service as that of the first embodiment.

A square wave-shaped recess 47 is formed in the second insulating film 44 between any two neighboring regions of the square wave-shaped inductance part 1C of the conductor layer 40. The first insulating layer 42 is exposed from the second insulating layer 44 through the recess 47.

The recess 47 is divided into seven portions located between respective neighboring regions of the square wave-shaped inductance part 1C of the conductor layer 40.

With the planar-type inductor according to the fourth embodiment, since the square wave-shaped inductance part 1C and recess 47 are provided instead of the spiral-shaped inductance part 1 and recess 17 in the first embodiment, the same advantages or effects as those in the first embodiment can be obtained.

The planar-type inductor according to the fourth embodiment is fabricated by a similar process sequence to that of the first embodiment.

FIFTH EMBODIMENT

Figure 12:
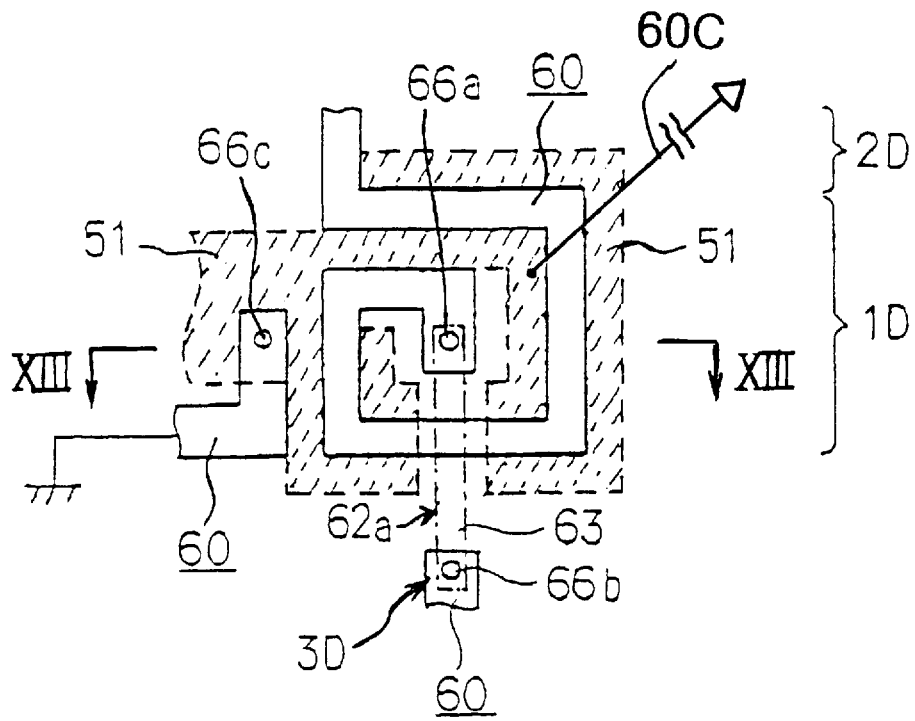
FIG. 12 is a schematic plan view of a planar-type inductor according to a fifth embodiment of the invention.
Figure 13:
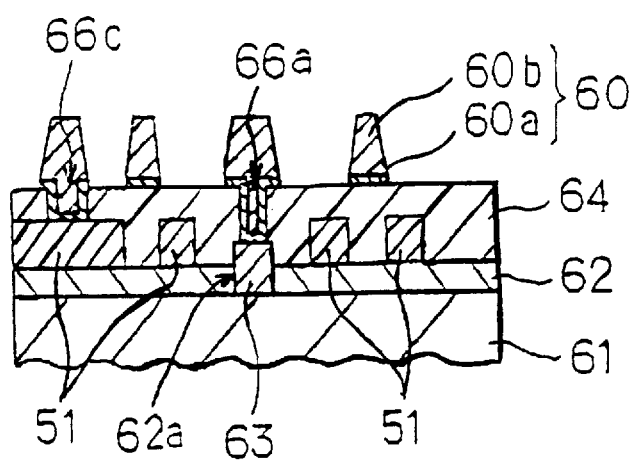
FIG. 13 is a cross-sectional view along the line XIII—XIII in FIG. 12, which shows the structure of the inductor according to the fifth embodiment.

A planar-type inductor according to a fifth embodiment of the present invention is shown in FIGS. 12 and 13.

As shown in FIG. 13, this inductor includes an insulating substructure composed of a semiconductor substrate 61, a first insulating layer 62 formed on a chief surface of the substrate 61 and having a linear contact hole 62a, and a second insulating layer 64 formed on the first insulating layer 62 and having three circular contact holes 66a, 66b and 66c. The surface of the second insulating layer 64 constitutes a chief surface of the substructure.

Each of the substrate 61 and the first and second insulating layers 62 and 64 may be made of the same material as that in the first embodiment.

A first patterned conductor layer 63, which has a linear plan shape, is formed to be contacted with the chief surface the substrate 61 through the linear contact hole 62a of the first insulating layer 62. The layer 63 is slightly protruded from the first insulating layer 62 through the contact hole 62a. The layer 63 runs from a position corresponding to the inner contact hole 66a to another position corresponding to the outer contact hole 66b.

As clearly shown from FIG. 12, a second patterned conductor layer 60 is formed on the surface of the second insulating layer 64. The second conductor layer 60 contains an inductance part 1D for providing a wanted inductance value and first and second lead parts 2D and 3D for electrically connecting the inductance part 1D to an external circuit located outside the inductor.

In the fifth embodiment, the inductance part 1D has a square spiral shape. The first lead part 2D has a strip-like shape and is joined to the outer end of the part 1D. The second lead part 3D also has a stripe-like shape; however, it is formed apart from the inductance part 1D.

The inner contact hole 66a of the second insulating layer 64 is located at the inner end of the inductance part 1D, in other words, at the center of the spiral pattern. The inner end of the inductance part 1D is electrically connected to one end of the underlying first conductor layer 63 through the hole 66a. The second lead part 3D is electrically connected to the other end of the underlying first conductor layer 63 through the hole 66b. Thus, the inner end of the inductance part 1D is electrically connected to the second lead part 3D through the first conductor layer 63. This means that the patterned first conductor layer 63 serves as an interconnection conductor for the inner end of the inductance part 1D and the second lead part 3D.

Unlike the first embodiment, in the inductor of the fifth embodiment, a patterned third conductor layer 51 is formed on the first insulating layer 62 between any two neighboring regions of the spiral-shaped inductance part 1D of the conductor layer 60, instead of the recess 17 in the first embodiment.

The third conductor layer 51 has a plan shape as shown in FIG. 12, which extends along the direction of the spiral pattern or the second conductor 60 on each side of the spiral pattern. In other words, the layer 51 is formed in the second insulating film 64 between any two neighboring regions of the spiral-shaped inductance part 1D of the second conductor layer 60.

To avoid the contact with the first conductor layer 63, the third conductor layer 51 does not exist in the periphery on the layer 63.

The second conductor layer 60 is contacted with and electrically connected to the underlying third conductor layer 51 through the contact hole 66c of the second insulating layer 64. The third conductor layer 51 is connected to the ground when the inductor is operated, as shown in FIG. 12.

The first insulating layer 62 serves to electrically insulate the patterned third conductor layer 51 from the underlying substrate 61. The second insulating layer 64 serves to electrically insulate the second conductor layer 60 from the underlying first conductor layer 63 and the third conductor layer 51.

The second conductor layer 60 has a two-layer structure made of a lower conductive sublayer 60a and an upper conductive sublayer 60b. Therefore, the lower conductive sublayer 60a is contacted with the second insulating layer 64 and the first and third conductor layers 63 and 51.

With the planar-type inductor according to the fifth embodiment, the patterned third conductor layer 51 is formed between the neighboring regions of the inductance part 1D on the first insulating layer 62, so that each region of the part 1D is put between the corresponding parts of the layer 51.

Therefore, if the third conductor layer 51 is kept at a constant electric potential (for example, at the ground level) on operation, the neighboring regions of the second conductor layer 60 are electrically shielded by the layer 51 due to the electrostatic shielding or screening phenomenon. This means that the parasitic capacitance between the neighboring regions of the inductance part 1D of the second conductor layer 10 is decreased.

Accordingly, the maximum operable frequency of the inductor can be restrained from lowering even if the inductance part 1D of the inductor is miniaturized.

Also, because the maximum operable frequency is restrained from lowering, the operable frequency range of the inductor can be expanded.

Figure 14A:
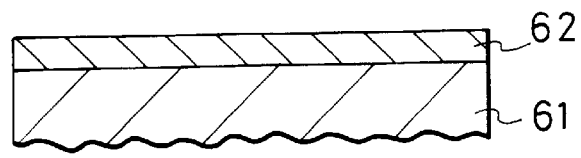
FIGS. 14A to 14J are cross-sectional views along the line XIII—XIII in FIG. 12, which show a fabrication process sequence of the inductor according to the fifth embodiment, respectively.
Figure 14B:
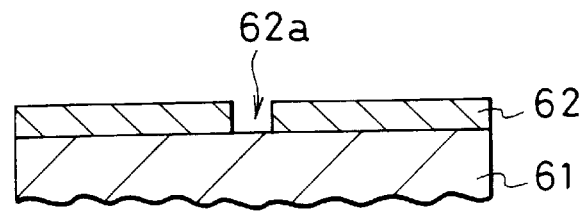

The planar-type inductor according to the fifth embodiment is fabricated by the following process sequence:

First, as shown in FIG. 14A, the first insulating layer 62 is formed on the chief surface of the semiconductor substrate 61 by a plasma-enhanced CVD technique or the like. The thickness of the layer 62 is, for example, 700 nm. The layer 62 is selectively etched to form the contact hole 62a at a position corresponding to the patterned first conductor layer 63 by a popular selective etching technique, as shown in FIG. 14B.

Figure 14C:
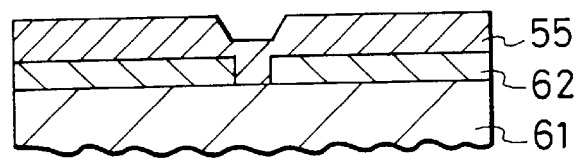
Figure 14D:
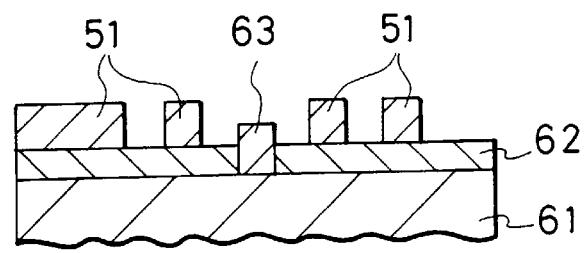

Next, as shown in FIG. 14C, a conductive layer 55, which is used for the first conductor layer 63 and the third conductor layer 51, is formed over the entire surface of the first insulating layer 62 by an evaporation or sputtering technique. For example, the layer 55 has a two-layer structure made of a tungsten (W) sublayer with thickness of 100 nm and a gold (Au) sublayer with thickness of 400 nm. The conductive layer 55 is then selectively removed by popular lithography and etching techniques, thereby forming the patterned first conductor layer 63 and the patterned third conductor layer 51, as shown in FIG. 14D.

Figure 14E:
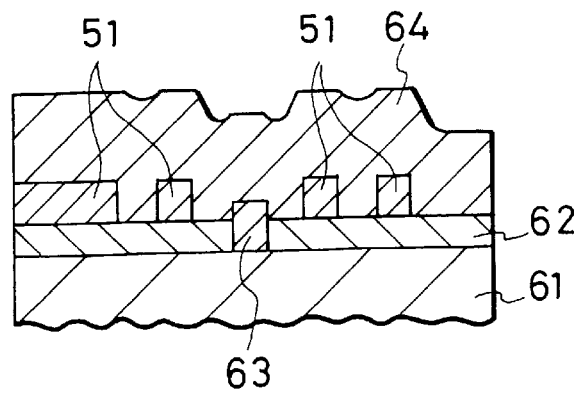
Figure 14F:
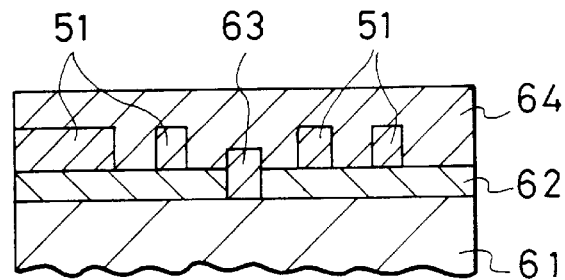

The second insulating layer 64 is formed on the exposed first insulating layer 62 to cover the first conductor layer 63 and the third conductor layer 51, as shown in FIG. 14E. The surface of the layer 64 is then planarized, as shown in FIG. 14F.

Figure 14G:
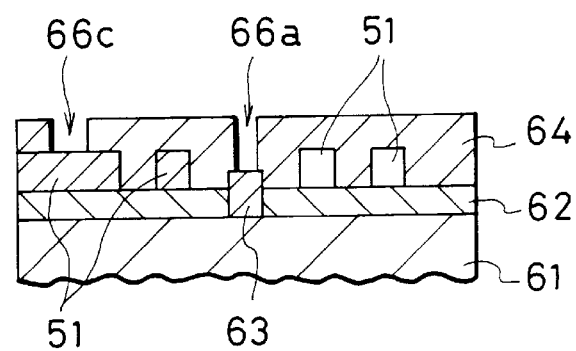

Further, the second insulating layer 64 is selectively etched to form the contact holes 66a, 66b and 66c by popular photolithography and etching techniques, resulting in the structure shown in FIG. 14G.

Figure 14H:
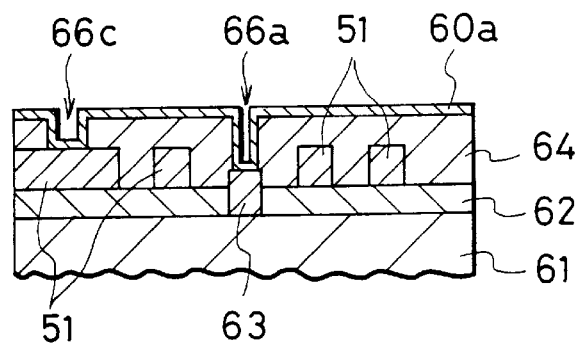
Figure 14I:
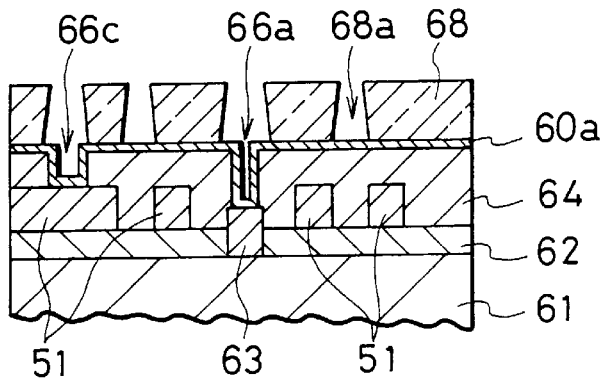

The lower conductive sublayer 60a is formed on the second insulating layer 64 by a popular evaporation or sputtering technique. As shown in FIG. 14H, the sublayer 60a is contacted with the exposed third conductor layer 51 through the contact hole 66c and the exposed first conductor layer 63 through the contact holes 66a and 66b. The sublayer 60a serves as a plating current path.

Subsequently, a patterned photoresist film 68 is formed on the lower conductive sublayer 60a by a popular photolithography technique. The film 68 has a spiral-shaped window 68a for the upper conductive sublayer 60b.

The lower conductive sublayer 60b may be made of titanium (Ti), platinum (Pt) and gold (Au) films which are successively formed on the second insulating layer 64 by a popular evaporation or sputtering technique.

The upper conductive sublayer 60b is formed on the film 68 to be contacted with the exposed lower conductive sublayer 60b through the window 68a by an electrolyte or electroless plating technique. The sublayer 60b is, for example, made of gold.

Figure 14J:
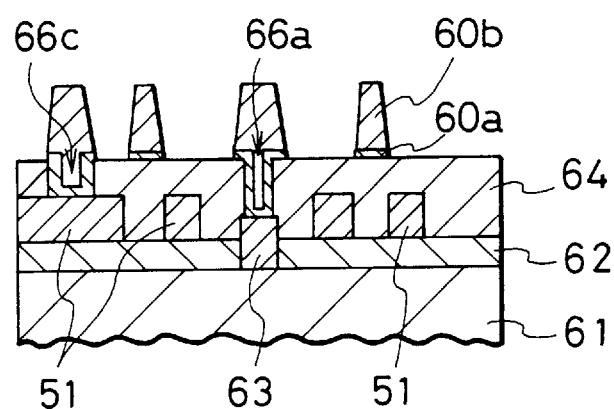

Further, the photoresist film 68 is removed, thereby remaining the upper conductive sublayer 60b on the lower conductive sublayer 60a with the spiral shape. The unwanted lower sublayer 60b located outside the window 68a of the photoresist film 68 is selectively etched, resulting in the planar-type inductor according to the fifth embodiment, as shown in FIG. 14J.

It is needless to say that the planar-type inductors according to the first to fifth embodiments may be any other method than those in this specification. Also, the pattern of the inductance parts 1, 1A, 1B, 1C and 1D may be changed to any other shape.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A planar-type inductor comprising;
 (a) an insulating substructure;
 (b) a patterned conductor layer having a predesigned geometric shape and formed on a chief surface of said substructure;
 said patterned conductor layer containing an inductance part for providing a wanted inductance value and a first lead part and a second lead part for electrically connecting said inductance part to an external circuit located outside said inductor;

said inductance part having a a plurality of adjacent regions; and (c) a recess formed in said substructure between said first region and any two of said plurality of adjacent regions of said inductance part;

wherein said any two adjacent regions of said inductance part have a parasitic capacitance which is reduced due to the existence of said recess.

2. A planar-type inductor as claimed in claim 1, wherein said substructure comprises a semiconductor substrate, a first insulating layer formed on a chief surface of said substrate, and a second insulating layer formed on said first insulating layer;

and wherein a surface of said second insulating layer constitutes said chief surface of said substructure;

and wherein said recess is formed in said second insulating layer.

3. A planar-type inductor as claimed in claim 2, wherein said inductance part of said conductor layer has a spiral plan shape;

and wherein said first lead part is directly joined to an outer end of said inductance part, and said second lead part is formed apart from said inductance part;

and wherein said second lead part is electrically connected to an inner end of said inductance part through an interconnection conductor formed in said second insulating layer.

4. A planar-type inductor as claimed in claim 1, wherein said inductance part of said conductor layer has a spiral plan shape;

and wherein said first lead part is directly joined to an outer end of said inductance part, and said second lead part is formed apart from said inductance part;

and wherein said second lead part is electrically connected to an inner end of said inductance part through an interconnection conductor formed in said substructure.

5. A planar-type inductor as claimed in claim 1, wherein said inductance part of said conductor layer has a spiral plan shape;

and wherein said first lead part is directly joined to an outer end of said inductance part, and said second lead part is formed apart from said inductance part;

and wherein said second lead part is electrically connected to an inner end of said inductance part through an interconnection conductor formed over said inductance part;

and wherein said interconnection conductor is formed to link said second lead part with said inner end.

6. A planar-type inductor as claimed in claim 5, wherein said interconnection conductor is a conductive wire.

7. A planar-type inductor as claimed in claim 1, wherein said recess is divided into at least two parts.

8. A planar-type inductor as claimed in claim 1, wherein said recess is continuous.

9. A planar-type inductor as claimed in claim 1, wherein said substructure is formed by an insulating substrate;

and wherein a chief surface of said insulating substrate constitutes said chief surface of said substructure;

and wherein said recess is formed in said substrate.

10. A planar-type inductor as claimed in claim 1, wherein said inductance part of said conductor layer has a spiral plan shape;

and wherein said first lead part is directly joined to an outer end of said inductance part, and said second lead part is formed apart from said inductance part;

and wherein said second lead part is electrically connected to an inner end of said inductance part through an interconnection conductor formed over said inductance part;

and wherein said interconnection conductor is formed to link said second lead part with said inner end.

11. A planar-type inductor as claimed in claim 10, wherein said interconnection conductor is a conductive wire.

12. A planar-type inductor as claimed in claim 1, wherein said inductance part of said conductor layer has a shape of a square wave;

and wherein said first lead part is directly joined to an outer end of said inductance part, and said second lead part is directly joined to another outer end thereof.

* * * * *

UNITED STATES PATENT AND TRADEMARK OFFICE
CERTIFICATE OF CORRECTION

PATENT NO. : 5,874,883
DATED : FEBRUARY 23, 1999
INVENTOR(S) : Kazuyoshi UEMURA, et al.

It is certified that error appears in the above-indentified patent and that said Letters Patent is hereby corrected as shown below:

On the title page, ITEM [30] Foreign Application Priority Data, delete " Aug. 17, 1995" and insert --July 18, 1995--.

Signed and Sealed this

Tenth Day of August, 1999

Attest:

Q. TODD DICKINSON

Attesting Officer

Acting Commissioner of Patents and Trademarks